United States Patent [19]

Averill

[11] Patent Number: 5,390,053
[45] Date of Patent: Feb. 14, 1995

[54] CIRCUIT FOR CONTROLLING THE OVERALL UPPER CUTOFF FREQUENCY OF AN AMPLIFIER STAGE

[75] Inventor: John S. Averill, Rochester, N.Y.

[73] Assignee: Eastman Kodak Company, Rochester, N.Y.

[21] Appl. No.: 95,971

[22] Filed: Jul. 22, 1993

[51] Int. Cl.6 .................................................. G11B 5/09
[52] U.S. Cl. .......................................... 360/46; 360/67
[58] Field of Search .............. 360/77.15, 77.04, 77.08, 360/77.05, 67, 68, 46; 330/291, 293, 104, 112

[56] References Cited

U.S. PATENT DOCUMENTS

| | | | |
|---|---|---|---|
| 3,149,294 | 9/1964 | Abel | 333/70 |
| 4,114,117 | 9/1978 | Ford | 333/70 |
| 4,165,495 | 8/1979 | Takahashi | 330/283 |
| 4,215,362 | 7/1980 | Ravizza | 360/77 |
| 4,354,160 | 10/1982 | Pierce | 330/107 |
| 4,360,788 | 11/1982 | Erps et al. | 331/1 A |
| 4,415,803 | 11/1983 | Muoi | 250/214 |
| 4,422,108 | 12/1983 | Sampei et al. | 360/65 |
| 4,446,493 | 5/1984 | Terui | 360/65 |
| 4,479,152 | 10/1984 | Chi | 360/46 |
| 4,494,153 | 1/1985 | Ravizza | 358/324 |
| 4,495,531 | 1/1985 | Sasamura | 360/65 |
| 4,498,001 | 2/1985 | Smoot | 250/214 |
| 4,500,932 | 2/1985 | Sato et al. | 360/65 |
| 4,565,974 | 1/1986 | Smoot | 330/304 |
| 4,633,200 | 12/1986 | Adler | 333/28 |
| 4,667,167 | 5/1987 | Kupfer | 330/281 |
| 4,870,631 | 9/1989 | Stoddart | 369/44 |
| 4,972,344 | 11/1990 | Stoddart et al. | 369/18 |
| 4,973,915 | 11/1990 | Batey | 330/151 |
| 5,173,649 | 12/1992 | Wise | 318/615 |

*Primary Examiner*—Donald Hajec
*Assistant Examiner*—Thien Minh Le
*Attorney, Agent, or Firm*—Francis H. Boos

[57] ABSTRACT

The circuit according to the invention comprises a circuit for receiving an input signal, the amplitude of which is proportional to the frequency of input signal; amplifier for providing an amplified output signal; bandwidth tracking located between input circuit and amplifier and defining a low-pass filtering stage and a voltage divider network, bandwidth tracking being controlled by servo in response to the output of amplifier, so that the upper cutoff frequency of low-pass filtering stage varies in a proportionate manner with the frequency of input signal and so that the amplitude of amplified output signal remains substantially constant.

5 Claims, 3 Drawing Sheets

CIRCUIT FOR CONTROLLING THE OVERALL UPPER CUTOFF FREQUENCY OF AN AMPLIFIER STAGE

FIELD OF THE INVENTION

This invention relates generally to what can be referred to as "bandwidth tracking", and more particularly to a circuit for controlling the overall upper cutoff frequency of an amplifier stage which receives an input signal, the amplitude of which is proportional to the frequency of said input signal. As an example, the input signal is received from a magnetic head.

BACKGROUND OF THE INVENTION

The desirability for "bandwidth tracking" as disclosed herein arises from a system requiring maximum signal-to-noise ratio in conjunction with a rather large range in operating frequency, such as a magnetic recording/play back system. A fixed bandwidth (upper cutoff frequency) based on maximum operating frequency would result in comparatively poor signal-to-noise ratio at the minimum operating frequency. Alternatively, a fixed bandwidth based on minimum operating frequency would be inadequate for higher frequency operation.

U.S. Pat. No. 4,446,493 discloses a variable frequency response equalizer which varies the time constant associated with the equalizer based on amplified signal. The magnitude of the time constant is reduced when the level of the signal amplified becomes lower than a predetermined value. Such a solution, as well as the approaches described in other patents of interest, i.e. U.S. Pat. No. 4,479,152, and U.S. Pat. No. 4,633,200 present the drawback of requiring very complex and sophisticated circuitry comprising transistors, delay means, switchable networks, voltage controlled amplifiers, etc.

SUMMARY OF THE INVENTION

Accordingly, it is an object of the present invention to provide a simple, inexpensive and efficient circuit for controlling the overall upper cutoff frequency of an amplifier stage over the range of operating conditions.

It is also another object of the present invention to control the overall upper cutoff frequency of such an amplifier stage under no-signal conditions, in order to reduce output noise under said conditions.

The circuit according to the invention comprises:

input means for receiving an input signal, the amplitude of which is proportional to the frequency of said input signal;

amplifier means for providing an amplified output signal; and bandwidth tracking means located between said input means and said amplifier means, said bandwidth tracking means defining a low-pass filtering stage and a voltage divider network, said bandwidth tracking means being controlled by servo means in response to the output of said amplifier means so that the amplitude of said amplified output signal remains substantially constant and so that the upper cutoff frequency of said low-pass filtering stage varies in a proportionate manner with the frequency of said input signal.

According to an aspect of the invention said bandwidth tracking means comprises an AGC element having a variable resistance $R_{agc}$ which is common to said low-pass filtering stage and said voltage divider network, the value of said variable resistance $R_{agc}$ being controlled by an AGC circuitry connected to the output of said amplifier means, a capacitor being connected in parallel to said variable resistance $R_{agc}$.

It is another object of the present invention to provide a magnetic head output circuitry for providing an improved signal-to-noise ratio, comprising:

magnetic transducer means for providing an input signal, the amplitude of which is proportional to the frequency of said input signal;

amplifier means for providing an output amplified signal; and bandwidth tracking means defining a low-pass filtering stage and a voltage divider network, said bandwidth tracking means being controlled by servo means in response to the output of said amplifier means so that the amplitude of said amplified output signal remains substantially constant and so that the overall upper cutoff frequency of said low-pass filtering stage varies in a proportionate manner with the frequency of said input signal.

These and other aspects, objects, features and advantages of the present invention will be more clearly understood and appreciated from a review of the following detailed description of the preferred embodiments and appended claims, and by reference to the accompanying drawings.

DESCRIPTION OF THE PREFERRED EMBODIMENTS

Although "bandwidth tracking" is the intended focal point in this disclosure, it is necessary, first, to discuss the automatic gain control (AGC) scheme which constitutes a central part of the circuit according to the invention.

Figure 1:
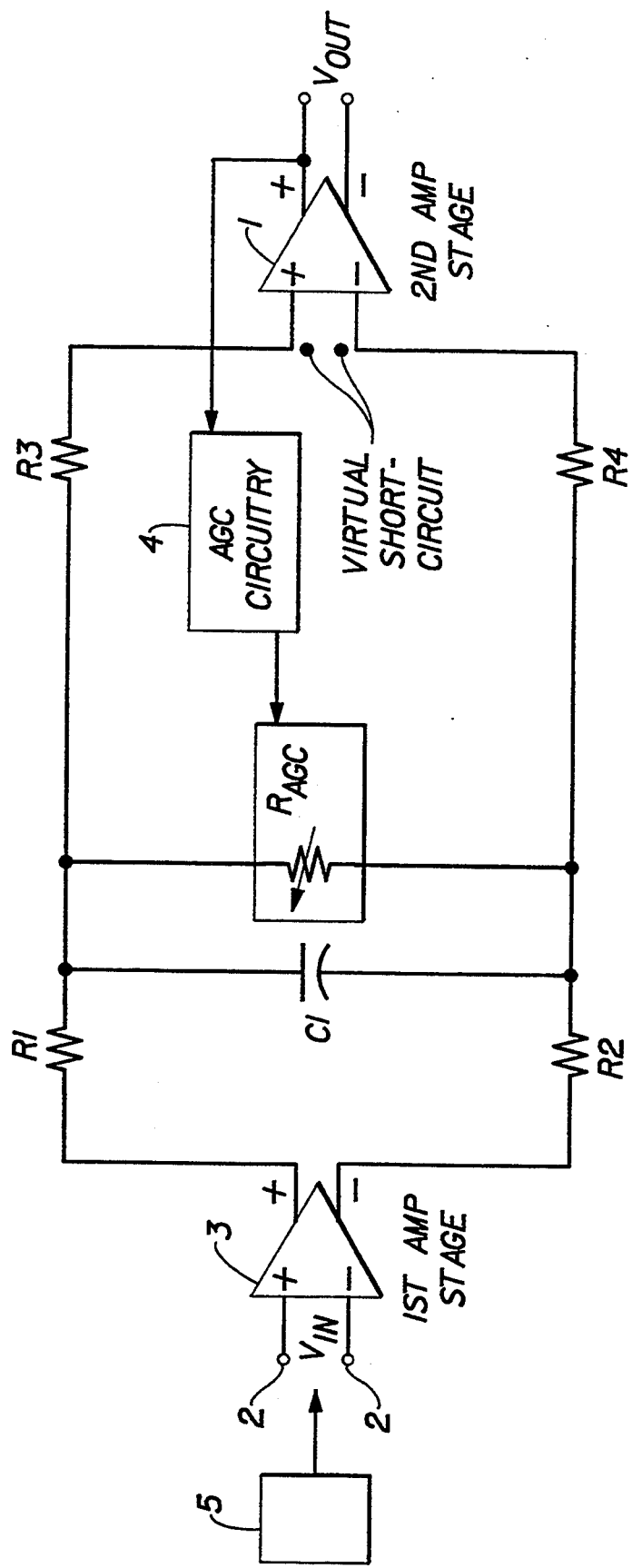
FIG. 1 schematically represents a first embodiment of the circuit according to the present invention.

Reference is now made to FIG. 1 of the drawing which shows an embodiment of the circuit according the invention. The AGC element (automatic gain control) is a device exhibiting a variable resistance, $R_{agc}$, which is a function of the input voltage provided by the AGC circuitry 4 (servo-system) in response to the output signal from output amplifier means 1. Although, differential amplifier means are represented in FIG. 1, it will be understood that other amplifier means can be used. The circuit according to the invention comprises bandwidth tracking means defining a low-pass filtering stage ($R_{agc}$, $C_1$, $R_1$-$R_4$) and a voltage divider network ($R_{agc}$, $R_1$-$R_4$). Variable resistance $R_{agc}$, in conjunction with resistors $R_1$, $R_2$, $R_3$, and $R_4$, constitutes the voltage divider network. Capacitor $C_1$, in conjunction with the equivalent resistance it "sees" which is a function of $R_1$, $R_2$, $R_3$, $R_4$, and $R_{agc}$, comprises a low-pass filtering network which establishes the overall upper cutoff frequency of the circuit. The circuit comprises means 2 for receiving an input signal, the amplitude of which is proportional to the frequency of said input signal. Advantageously, the input signal is provided by a magnetic head 5, the frequency of which is dependent on the recording medium transport speed. According to a preferred embodiment, the input signal is sent through a pre-amplifier stage 3, located between means 2 for receiving the input signal and the filtering means whose operation will be described in more detail below.

Figure 3:
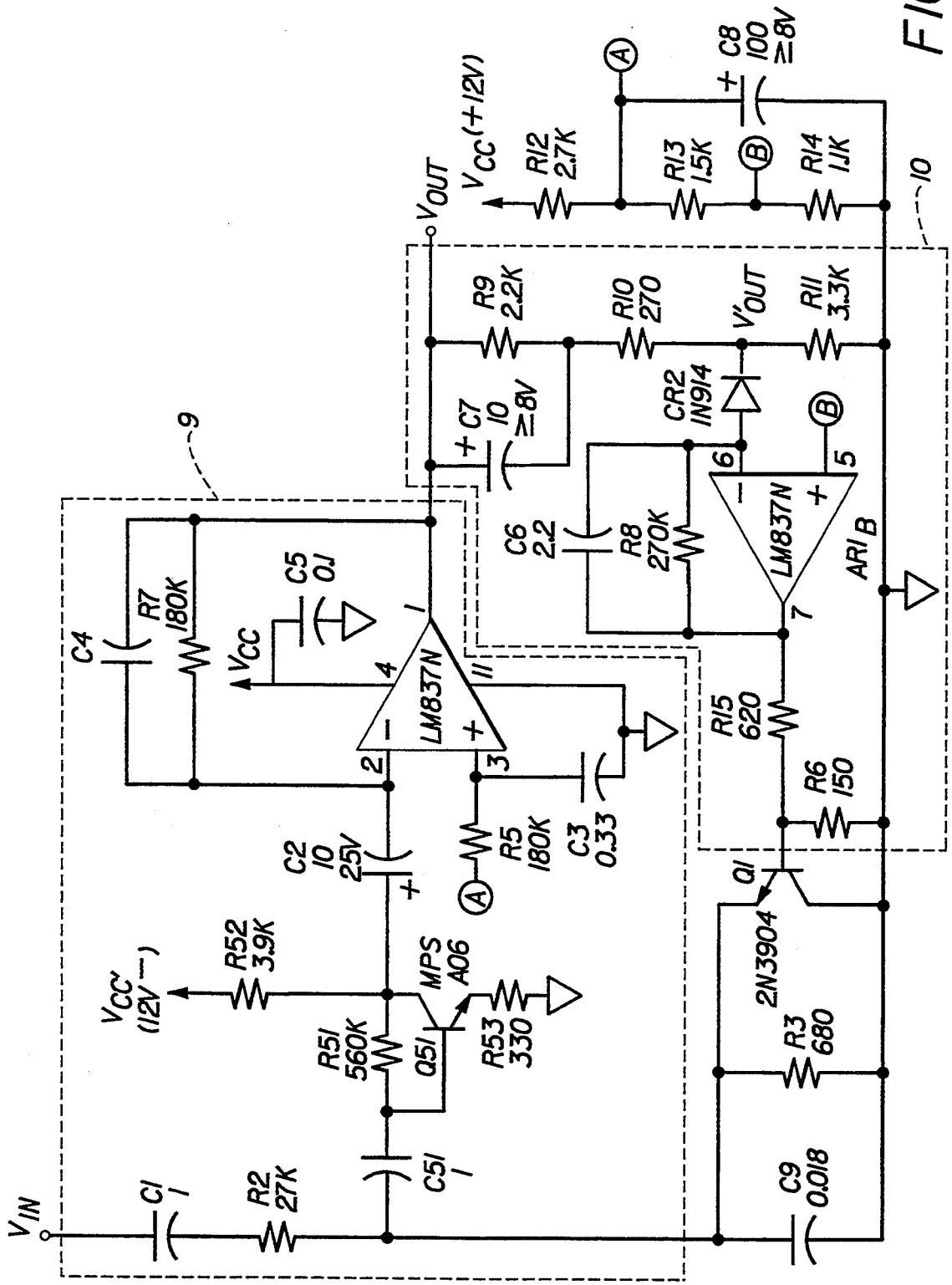
FIG. 3 represents a specific implementation of the invention.

Such AGC elements along with the AGC circuitry 4 which controls the input voltage to $R_{agc}$ are well known and, for example, are described in U.S. Pat. No. 4,415,803. An example of such an AGC circuitry is also shown in FIG. 3 (see reference 10; FIG. 3). Typically it comprises a clamp and peak detector circuit and a difference amplifier which generates a control signal which regulates the variable resistance. The operation of such a circuit will be now described in detail. The input signal is such that an increase of the operating frequency, results in a proportionate increase in the input voltage amplitude. This initially results in an increased output voltage amplitude $V_{out}$. The AGC circuitry 4 correspondingly applies a increased DC voltage to the AGC variable resistance $R_{agc}$ such that $V_{out}$ is restored to an initial "selected" value. In essence, the value of $R_{agc}$ becomes whatever it must be to maintain a substantially constant output voltage amplitude, $V_{out}$, due to the feedback loop comprised of the AGC circuitry 4. The decrease in $R_{agc}$ results in a decrease in the equivalent resistance "seen" by capacitor $C_1$ which is connected in parallel to the AGC variable resistance, $R_{agc}$. Correspondingly, the upper cutoff frequency is increased in a proportionate manner with the frequency of said input signal. On the other hand, a decrease of the operating frequency results in a proportionate decrease in the input voltage amplitude. This initially results in a decreased output voltage amplitude $V_{out}$. The AGC circuitry 4 correspondingly applies a decreased DC voltage to $R_{agc}$ such that $V_{out}$ is restored to its initial selected value. The increase in $R_{agc}$ results in an increase in the equivalent resistance seen by capacitor $C_1$. Correspondingly, the upper cutoff frequency is decreased in a proportionate manner with the frequency of said input signal. In fact, analysis has shown that the overall upper cutoff frequency is proportional to (the 1st power of) operating frequency, to the extent that $V_{out}$ remains constant. Advantageously, the AGC variable resistance is comprised of a transistor (such as an 2N3904). As is well known for such a device, the collector-emitter characteristic is a variable resistance, which is inversely-related to base-emitter voltage.

Figure 2:
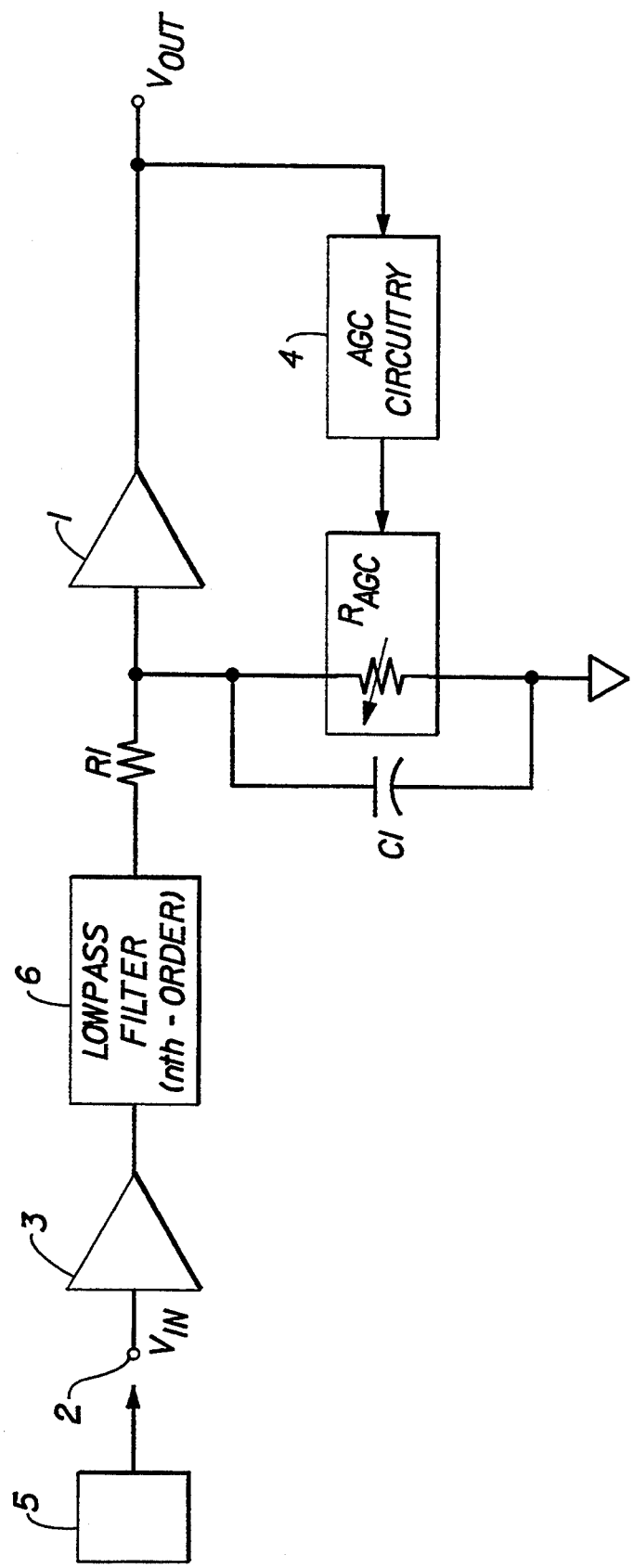
FIG. 2 schematically represents a second embodiment of the circuit according to the present invention.

Such a circuit as described in FIG. 1 controls the overall upper cutoff frequency over the range of operating conditions (the presence of signal). FIG. 2 to which it is now made reference, represents a simplified schematic of a circuit which carries out a "bandwidth tracking" as explained herebefore and also allows to reduce the output noise under no-signal conditions. As in FIG. 1, the low-pass filtering stage providing "bandwidth tracking", is comprised of $C_1$ and the equivalent resistance it "sees" (a function of $R_{agc}$ and $R_1$). Such a filter is a first order low-pass filter. The voltage divider network is comprised of $R_{agc}$ in conjunction with $R_1$. In order to achieve minimum noise under operating conditions, an nth-order (2nd or higher order) low-pass filter 6 is connected to the pre-amplifier stage 3, upstream of the 1st order low-pass filter "bandwidth tracking" means). The bandwidth tracking means is designed such that the upper cutoff frequency of this low-pass filtering stage ($F_{uc/bwt}$) is sufficiently greater than (e.g. 2.5 times) the cutoff frequency of the nth—order low-pass filter ($F_{uc/lpf}$) under operating conditions. Thus the overall upper cutoff frequency $F_{uc}$ approximately equals (is somewhat less than) $F_{uc/lpf}$.

Under no-signal conditions, $F_{uc/bwt}$ achieves its minimum value ($R_{agc}$ is maximum) and can be much less than $F_{uc/lpf}$ (depending on the $F_{uc/lpf}$ value), in which case the overall upper cutoff frequency $F_{uc}$ is much less than $F_{uc/lpf}$, resulting in a substantial reduction in the output noise.

Reference is now made to FIG. 3 which schematically shows a specific implementation of the invention. $Q_1$ is a transistor, the collector emitter characteristic of which is the variable resistance $R_{agc}$ of the "bandwidth tracking" means. $C_9$ is the capacitor for the "bandwidth tracking" means (corresponding to $C_1$ in FIG. 2. $ARI_B$ and associated parts 10 comprise the AGC circuitry which controls the input voltage to $Q_1$ ($R_{agc}$) in response to the value of $V_{out}$, so that, as explained herebefore, $V_{out}$ remains substantially constant and so that the upper cutoff frequency of the low-pass filtering means varies in a proportionate manner with the frequency of the input signal. $ARI_A$ and associated parts 9 comprise the output amplifier (corresponding to 1 in FIGS. 1 and 2). In the embodiment shown in FIG. 3, as a way of example, resistor values are in OHMS, capacitor values are in micro-farads, except where otherwise indicated.
- $V_{out/peak}$ (steady state): 1.5V for 120 mV$<V_{in/peak}<$2.6V
- Max. voltage gain: 13.4
- Input impedance 27 K$\Omega$
- Bandwidth (−3dB):9.1 Hz to $F_{uc}$; with
  - $F_{uc}$=13.6 KHz for $V_{in/peak}<$107 mV (no signal)
  - Fuc (KHz)=1.943+108.9 $V_{in/peak}(V)$ for $V_{in/peak}<$2.0V The specific implementation shown in FIG. 3 has been used to embody the circuit shown in FIG. 2. Testing of this has demonstrated an 11.6 dB reduction in no-signal output noise for an overall upper cutoff frequency $F_{uc}$ of 100 KHz.

The invention has been described with reference to a preferred embodiment. However, it will be appreciated that variations and modifications can be effected by a person of ordinary skill in the art without departing from the scope of the invention.

PARTS LISTS FOR FIGURES 1–3

1. AMPLIFIER MEANS
2. INPUT RECEIVING MEANS
3. PRE-AMPLIFIER STAGE
4. AGC CIRCUITRY
5. MAGNETIC TRANSDUCER MEANS
6. $N$TH ORDER LOW-PASS FILTER
9. INPUT STAGE (FIG. 3)
10. AGC CIRCUITRY (FIG. 3)

What is claimed is:

1. A circuit for controlling the overall upper cutoff frequency of an amplifier stage comprising:
   input means for receiving an input signal, the amplitude of which is proportional to the frequency of said input signal;
   amplifier means for providing an amplified output signal; and
   bandwidth tracking means located between said input means and said amplifier means, said bandwidth tracking means comprised of a low-pass filtering stage, a voltage divider network and a capacitance across said voltage divider network, said bandwidth tracking means being controlled by servo means in response to the output of said amplifier means so that the amplitude of said amplified output signal remains substantially constant and so that the voltage divider network and capacitance are operative to vary the upper cutoff frequency of said low-pass filtering stage in a proportionate manner with the frequency of said input signal.

2. A circuit according to claim 1 wherein said bandwidth tracking means further comprises an AGC element having a variable resistance $R_{agc}$ which is common to said low-pass filtering stage and said voltage divider network, the value of said variable resistance $R_{agc}$ being controlled by an AGC circuitry connected to the output of said amplifier means, and said capacitance comprising a capacitor connected in parallel to said variable resistance $R_{agc}$.

3. A circuit according to claim 1, wherein said input signal is provided by a magnetic head.

4. A circuit according to claim 1 comprising further low-pass filtering means located between said input means and said low-pass filtering stage, said further low-pass filtering means being at least of a second order.

5. A circuit according to claim 2, wherein said variable resistance $R_{agc}$ is comprised of the collector—emitter characteristic of a transistor.

* * * * *